(12) United States Patent
Voisine et al.

(10) Patent No.: US 8,432,655 B2
(45) Date of Patent: Apr. 30, 2013

(54) POWER MANAGEMENT ARRANGEMENT AND METHOD IN A UTILITY METER

(75) Inventors: John T. Voisine, Lafayette, IN (US); Steven Schamber, Lafayette, IN (US)

(73) Assignee: Landis+Gyr Inc., Lafayette, IN (US)

( * ) Notice: Subject to any disclaimer, the term of this patent is extended or adjusted under 35 U.S.C. 154(b) by 213 days.

(21) Appl. No.: 13/077,703

(22) Filed: Mar. 31, 2011

(65) Prior Publication Data

US 2011/0242715 A1   Oct. 6, 2011

Related U.S. Application Data

(60) Provisional application No. 61/319,721, filed on Mar. 31, 2010.

(51) Int. Cl.
*H02H 3/06* (2006.01)

(52) U.S. Cl.
USPC ............................................................ 361/65

(58) Field of Classification Search ...................... 361/65
See application file for complete search history.

(56) References Cited

U.S. PATENT DOCUMENTS

| | | | |
|---|---|---|---|
| 4,390,876 A * | 6/1983 | Bjorklund et al. | 340/3.7 |
| 5,014,213 A * | 5/1991 | Edwards et al. | 702/62 |
| 6,275,168 B1 * | 8/2001 | Slater et al. | 340/870.02 |
| 6,377,037 B1 * | 4/2002 | Burns et al. | 324/142 |
| 6,657,424 B1 * | 12/2003 | Voisine et al. | 324/76.11 |
| 6,882,137 B1 * | 4/2005 | Voisine | 324/76.11 |
| 7,091,878 B2 * | 8/2006 | Holle et al. | 340/870.02 |
| 7,504,821 B2 * | 3/2009 | Shuey | 324/142 |
| 2002/0036492 A1 * | 3/2002 | Slater et al. | 324/142 |
| 2007/0096769 A1 * | 5/2007 | Shuey | 324/771 |
| 2009/0015234 A1 * | 1/2009 | Voisine et al. | 323/355 |
| 2011/0095625 A1 * | 4/2011 | Voisine | 307/143 |
| 2011/0121664 A1 * | 5/2011 | Voisine | 307/143 |

* cited by examiner

*Primary Examiner* — Ronald W Leja
(74) *Attorney, Agent, or Firm* — Maginot, Moore & Beck (57) ABSTRACT

An arrangement for controllably disconnecting a utility power service from a load includes a utility meter housing, a service switch, an energy storage device and a control circuit. The utility meter housing includes metrology circuitry configured to generate metering information regarding electrical power provided to the load. The service switch is configured to controllably interrupt a connection between the utility power service and the load, and has a controller. The control circuit is configured to cause the energy storage device to be connected to the controller responsive to a service disconnect command. The control circuit is further configured to cause a portion of the metrology circuit to be connected to the energy storage device and the meter power supply to be disconnected from the portion of the metrology circuit responsive to a power interruption detection signal.

16 Claims, 4 Drawing Sheets

POWER MANAGEMENT ARRANGEMENT AND METHOD IN A UTILITY METER

This application claims the benefit of U.S. Provisional Patent Application Ser. No. 61/319,721, filed Mar. 31, 2010, which is incorporated herein by reference.

FIELD OF THE INVENTION

The present invention relates to utility meters having electrical service disconnect features.

BACKGROUND

Electrical service providers such as electrical utilities employ electricity meters to monitor energy consumption by customers (or other entities). Electricity meters track the amount of energy consumed by a load (e.g. the customer), typically measured in kilowatt-hours ("kwh"), at each customer's facility. The service provider uses the consumption information primarily for billing, but also for resource allocation planning and other purposes.

Electrical power is transmitted and delivered to load in many forms. For example, electrical power may be delivered as polyphase wye-connected or delta-connected power or as single phase power. Such various forms are known as service types. Different standard electricity meter types, known as meter forms, are used to measure the power consumption for the various service types. The commonly used meter forms in the United States include those designated as 2S, 3S, 5S, 45S, 6S, 36S, 9S, 16S, 12S and 25S meter forms, which are well known in the art.

Electrical service providers have historically billed for electrical service in arrears, using information stored within the electricity meter to determine the amount of each invoice. In a typical operation, the electricity meter stores a value representative of the amount of energy consumed in a mechanical or electronic accumulation register. From time to time, the electrical service provider obtains the value of the register and bills the customer accordingly. For example, a meter reader employed by the service provider may, each month, physically read the register value off of a meter display. The service provider then employs the obtained register value to determine the amount of electricity consumed over the month and bills the customer for the determined amount.

Historically, electricity meters employed electromechanical means, including rotating disks and mechanical counters, to detect and register electricity consumption. While such electromechanical meters are still common, meters increasingly employ digital processing circuitry instead of the rotating disk and mechanical counters. In such meters, sensors within the meter detect the voltage and current that is delivered to the load. Circuitry within the meter converts the sensed voltage and current into digital values. Processing circuitry then employs digital signal processing to calculate consumed energy, among other things, from the digital values. Electronic meters provide greater flexibility in the types of energy consumption information that they can calculate, track, and store. Electronic meters can also facilitate remote meter reading by including a communication means such as radio communication circuits.

One of the few drawbacks of electronic meters is that the metrology and processing circuits require an electronic power supply. While electrical power is readily available in an electricity meter, issues can arise in the event of an electrical service interruption. During electrical service interruption, the electronic power supply cannot operate and is unable to bias the internal circuits. As a consequence, stored data can be lost during a power outage. To avoid such losses, it is known to employ temporary power from a battery or large capacitor to store critical meter data to non-volatile memory within the meter in the event of an external power interruption. The capacitor or battery provides temporary power for the meter to gracefully power down when the external utility power is lost.

Another issue relating to electrical service interruptions arises from a relatively recent feature in metering known as "last gasp" transmissions. With the increasing use of RF communications in meters, utilities find it advantageous to receive a radio transmission from meters when they detect a power service interruption. This transmission ideally occurs before the meter loses all power. The utilities can use such transmissions from several meters in an affected area to help locate the source of the service issue. However, the communication devices inside the electricity meter (including mechanical meters that employ communication circuits) require some form of energy storage to allow for a "last gasp" transmission feature in the event of a power outage. It is common to implement a storage device such as an electrolytic capacitor to provide the necessary energy in the event of a power outage.

A further feature sometimes employed in electricity meters is a switch that disconnects and reconnects the customer load to the electrical service upon receiving a command to operate. Such switches are sometimes referred to as service switches. Service switches commonly use a DC solenoid mechanism or a DC gear motor mechanism to effect a switching operation. To provide the necessary energy for a switching operation the power supply needs to be designed with enough capacity to source the necessary energy to operate the switch. Alternately a smaller power supply is sometimes used in conjunction with an energy storage device, such as an electrolytic capacitor, where the energy stored in the capacitor is used to operate the switch. In the case of a smaller power supply, the energy storage capacitor is first "charged" over a period of time, such as several seconds, before a switching operation is performed.

One issue with meters is the additional size and components required to facilitate power fail operations and service switch operations. There is a need therefore, for a metering arrangement that employs power fail operations and service switch operations with reduced component count and/or size.

SUMMARY

At least some embodiments of the present invention address the above-referenced issue by implementing multiple specific operations to allow selective connection of the same energy storage device to power either power fail operations and service switch operations. The use of the same power storage device for both operations eliminates the need for separate storage devices, and/or the use of a power supply that is large enough to operate the service switch.

An arrangement for controllably disconnecting a utility power service from a load includes a utility meter housing, a service switch, an energy storage device and a control circuit. The utility meter housing includes metrology circuitry configured to generate metering information regarding electrical power provided to the load. The service switch is configured to controllably interrupt a connection between the utility power service and the load, and has a controller. The control circuit is configured to cause the energy storage device to be connected to the controller responsive to a service disconnect command. The control circuit is further configured to cause a portion of the metrology circuit to be connected to the energy storage device and the meter power supply to be disconnected from the portion of the metrology circuit responsive to a power interruption detection signal.

The above-described features and advantages, as well as others, will become more readily apparent to those of ordinary skill in the art by reference to the following detailed description and accompanying drawings.

DETAILED DESCRIPTION

Figure 1:
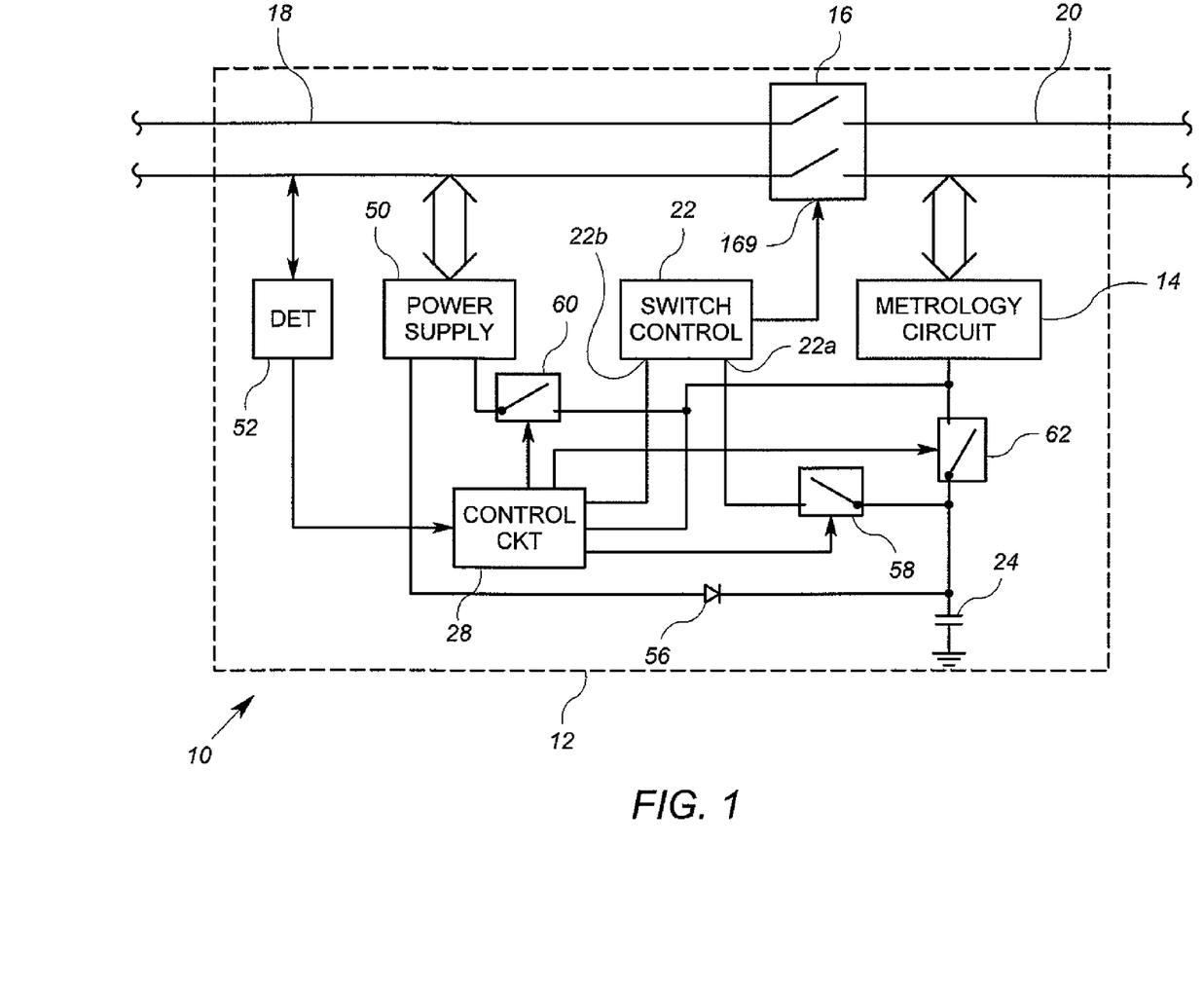
FIG. 1 is a schematic block diagram of an arrangement according to a first exemplary embodiment of the invention.

FIG. 1 shows an arrangement 10 for controllably disconnecting a utility power service from a load. The arrangement 10 includes a utility meter housing 12 in which is supported metrology circuitry 14 that is configured to generate metering information regarding electrical power provided to the load. The electric utility, not shown, provides electrical power via line side conductors 18 to the arrangement 10. The load side conductors or feeder lines 20 distribute the power received from the line side conductors 18 to the load, not shown. The arrangement 10 further includes a service switch 16, a service switch controller 22, an energy storage device 24, a processing or control circuit 28, and a power interruption detection circuit 52, all of which are supported in or on the housing 12. It will be appreciated that the housing 12 further can support other meter circuitry, not shown in FIG. 1.

The metrology circuit 14 is any suitable circuit that detects, measures, and determines one or more electricity and/or electrical energy consumption values based on energy flowing from the line-side conductors 18 to the load-side conductors 20. Such circuits are known in the art and can take many forms. A non-limiting example of a suitable metrology circuit is described below in connection with FIG. 2. In this embodiment, the metrology circuit 14 may include an RF communication device, not shown that is configured to transmit meter data to a remote device.

The service switch 16 is a relay or other switch configured to controllably interrupt a connection between the utility power service and the load. To this end, the service switch 16 has terminals connected in series between the line side power conductors 18 and the load side power conductors 20. The service switch 16 includes an input 16a that receives mechanical force or the like that can be used to open or close the switch.

The switch controller 22 is operably connected to the service switch control input 16a to open and close the switch. The switch controller 22 may suitably include a source of motive force and direction control circuits, not shown. Suitable examples of controllable motors and solenoids are well known in the art. A suitable example of a switch controller 22 may be found in U.S. patent application Ser. No. 12/911,715, filed Oct. 25, 2010, assigned to the assignee of the present invention, and which is incorporated herein by reference. The switch controller 22 has an output (e.g. a mechanical output) that is configured to cause the service switch 16 to controllably interrupt and reconnect the connection between the conductors 18 and 20. The switch controller 22 further includes a power input 22a for receiving electrical power, and a control input 22b for receiving signals suitable for controlling whether the switch controller 22 causes the switch 16 to open or to close.

More specifically, in response to "open" signals received at the input 22b, the switch controller 22 is configured to generate a mechanical output that causes the switch 16 to open, provided that sufficient electrical power is provided to the power input 22a. Similarly, in response to "close" signals received at the input 22b, the switch controller 22 is configured to generate a mechanical output that causes the switch 16b to close, provided that sufficient electrical power is provided to the power input 22a. As discussed above, a suitable switch control circuit may include a source of motor force, such as a motor, and drive circuitry that can drive the motor in one direction responsive to "open" signals, another direction responsive to "close" signals, given the availability of power at the power input. One suitable circuit is shown in FIG. 3 of U.S. patent application Ser. No. 12/911,715, discussed above.

The power supply 50 is a meter power supply configured to provide normal operating power to the metrology circuit 14 of the meter, as well as to the control circuit 28. To this end, the power supply 50 is coupled to the metrology circuit 14 and bias input of the control circuit 28 via a switch 60. In the embodiment described herein, the power supply 50 is not sufficiently sized to power the service switch controller 22. In addition, the power supply 50 may not be sufficiently sized to provide power to special circuits, such as a radio circuit that may form a part of a metrology circuit 14. The power supply 50 is, however, configured to provide a charging current to the energy storage device 24. To this end, the power supply is operably coupled to the energy storage device 24 via a diode 56. The diode 56 is provided to prevent discharge of the energy storage device 24 back through the power supply 50.

The limitations of on the power supply 50 allow for the power supply to be of reduced relative size and weight. If the power supply 50 were sized to provide sufficient power to operate the service switch 16 and all other meter functions, the power supply 50 would require much larger components. Because the service switch 16 is used relatively infrequently, the extra capacity of the power supply would go unused most of the time. The size and weight cost of the extra capacity, which is largely unused, is wasteful. Accordingly, it is advantageous to employ a smaller power supply that is not capable of operating the service switch and/or radio transmitter.

Nevertheless, in order to make power available to the switch controller 22, an energy storage device 24 is coupled to the input 22a to provide power thereto. To this end, the energy storage device 24 may suitably be one or more capacitors, super-capacitors, or the like. As shown in FIG. 1, the energy storage device 24 is coupled to the switch controller 22 via a switch 58.

As will be discussed below, the energy storage device 24 is also used to provide temporary power to at least a portion of the metrology circuit 14 in the event of a utility power interruption. Accordingly, the energy storage device 24 is also coupled to power inputs of at least some elements of the metrology circuit 14 via a switch 62. For normal metering operations, however, the power supply 50 is coupled to the metrology circuit 14 via switch 60. The power supply 50 provides power to the metrology circuit 14 when utility power is available.

The power interruption detection circuit 52 is a circuit configured to detect an interruption of power from the utility.

To this end, the detection circuit 52 is operable coupled to detect voltage on the line-side conductors 18 and provide a detection signal if the average or RMS voltage on line-side conductors 18 falls below a predetermined level. Such circuits are known in the art. The detection circuit 52 is operably coupled to provide the detection signal (indicative of a power failure) to the control circuit 28.

The control circuit 28 is operably coupled to the input 22b of the switch controller 22 to provide "open" control signals and "close" control signals for the operation of the switch 16. The control circuit 28 is further coupled to control inputs of the switches 58, 60 and 62.

The control circuit 28 is any logic circuit, processor or controller capable of carrying out the operations ascribed to it herein. In many cases, the control circuit 28 comprises the same chip and/or processor or controller that performs many of the operations of the metrology circuit 14. It is known in the metering art to employ the same processor for both metrology operations and controller operations.

The control circuit 28 is further configured to receive a disconnect command signal, for example, from a remote or external device through another circuit, not shown. In response to a disconnect command, the control circuit 28 is configured to provide control signals that cause the energy storage device 24 to be connected to the switch controller 22, and to provide "open" control signals to the control input 22b. The control circuit 28 is further configured to receive a reconnect command, for example, from a remote or external device. In response to a reconnect command, the control circuit 28 is configured to provide control signals that cause the energy storage device 24 to be connected to the switch controller 22, and to provide "close" control signals to the control input 22b.

The control circuit 28 is still further configured to, in response to a power interruption detection signal from the detection circuit 52, cause the power supply 50 to be disconnected from the metrology circuit 14 and cause the energy storage device 24 to be connected to the metrology circuit 14.

In normal energy delivery operation, the service switch 16 is closed, and the utility thereby provides electricity to the load via the line-side conductors 18 and the load-side conductors 20. The metrology circuit 14 senses or otherwise measures the electrical energy flowing through the load-side conductors 20 and generates metering information therefrom. In such normal operation, the switch 60 is closed, thereby operably connecting the power supply 50 to the metrology circuit 14. In addition, the switches 58 and 62 are open, thereby disconnecting the energy storage device 24 from the switch controller 22 and metrology circuit 14, respectively. Because the switch controller 22 does not receive power from the energy storage device 24, the switch controller 22 cannot change the state of the switch 16.

From time to time, it may be necessary for the electrical service to be disconnected from the load. In such a case, the control circuit 28 receives a command signal (i.e. a data signal with instruction data) from an external source indicating that the service is to be disconnected. To this end, the control circuit 28 is operably connected to a communication circuit, which as discussed above may be a part of the metrology circuit 14, that receives signals from a remote transmitter. Alternatively, in a prepaid meter configuration, the control circuit 28 may generate the command signal internally upon determining that a prepaid amount of energy has been consumed. A prepaid meter is one in which a consumer prepurchases energy using a debit card or the like. The meter disconnects the service when the prepurchased energy has been consumed, and reconnects the service when more is purchased.

In any event, responsive to the command signal, the control circuit 28 generates a signal that causes the switch 58 to close, thereby connecting the energy storage device 24 to the power input 22a of the switch controller 22. The control circuit 28 further provides "open" control signals to the control input 22b of the switch controller 22. As a consequence of the received "open" control signal and power from the energy storage device 24, the switch controller 22 causes the switch 16 to open.

Once the switch 16 is open, electrical energy cannot flow to the load-side conductor 20 from the line-side conductors 18. Thus, the electrical service has been disconnected from the load.

Once the disconnect operation is complete, the control circuit 28 causes the switch 58 to open, and removes the control signals from the control input 22b. As a consequence, the switch controller 22 is disconnected from the energy storage device 24. It is noted that the power supply 50 operates to recharge the energy storage device 24 while the switch 58 is open via the diode 56.

At some subsequent time, the control circuit 28 starts a process to reconnect or restore the electrical service to the load. The restoration process may commence responsive to a newly received command from an external source. Alternatively, software within the control circuit 28 may generate the command based on a predetermined amount of time passing since the disconnection, or based on receipt of information indicating further prepayment for services.

Responsive to the command signal, the control circuit 28 generates a signal causing the switch 58 to operably connect the charge storage device 24 to the switch controller 22, and provides "close" control signals to the control input 22b. As a consequence of the received "close" control signal and power from the energy storage device 24, the switch controller 22 causes the switch 16 to close.

Once the switch 16 is closed, electrical energy again flows to the load-side conductor 20 from the line-side conductors 18. Thus, the load has its electrical service restored. During the normal state, the control circuit 28 causes the switch 60 to be closed, and the switches 58 and 62 to be open, as discussed further above. The power supply 50 recharges the energy storage device 24 via the diode 56.

From time to time, a power interruption may occur. In such cases, it is desirable for the metrology circuit to perform some power down operations, which may include storage of critical data to non-volatile memory, and/or transmission of a signal to a remote device.

Upon reception of a power interruption detection signal from the detection circuit 52, the control circuit 28 closes the switch 62 and opens the switch 60. To this end, the control circuit 28 typically has access to a small burst of energy capable of powering the control circuit 28 to carry out a few short tasks. Once the switch 62 is closed, however, the energy storage circuit 24 is connected to the metrology circuit 14 (and control circuit 28), allowing for a significant amount of power down operations to take place. Such operations may include the storage of critical data to non-volatile memory, and/or transmission of signals to a remote device. To this end, the switch 62 also controllable couples the energy storage device 62 to any communication circuits in the meter.

When power is restored, as detected by the energy detection device 52 and subsequent repowering of the control circuit 28, the control circuit 28 causes the switch 62 to open, and for the switch 60 to close. These operations should be inherent to the initial power-up sequence of the meter that is executed any time the power supply 50 of the meter first receives power. The meter then operates normally.

It is also typical for the meter to transmit data using communication circuits during normal operation. If during normal operation, the control circuit 28 or metrology circuit 14 determines that a transmission must be made from the meter communication circuit, not shown in FIG. 1, then the control circuit can connect the switch 62 to provide the additional power required for operation of the radio from the energy storage device 24.

The above-described design thus employs a single energy storage device (or single bank of energy storage devices) to 1) provide power to a service switch, 2) provide power to a communication circuit, and 3) provide power for operations in the event of a power interruption.

Figure 2:
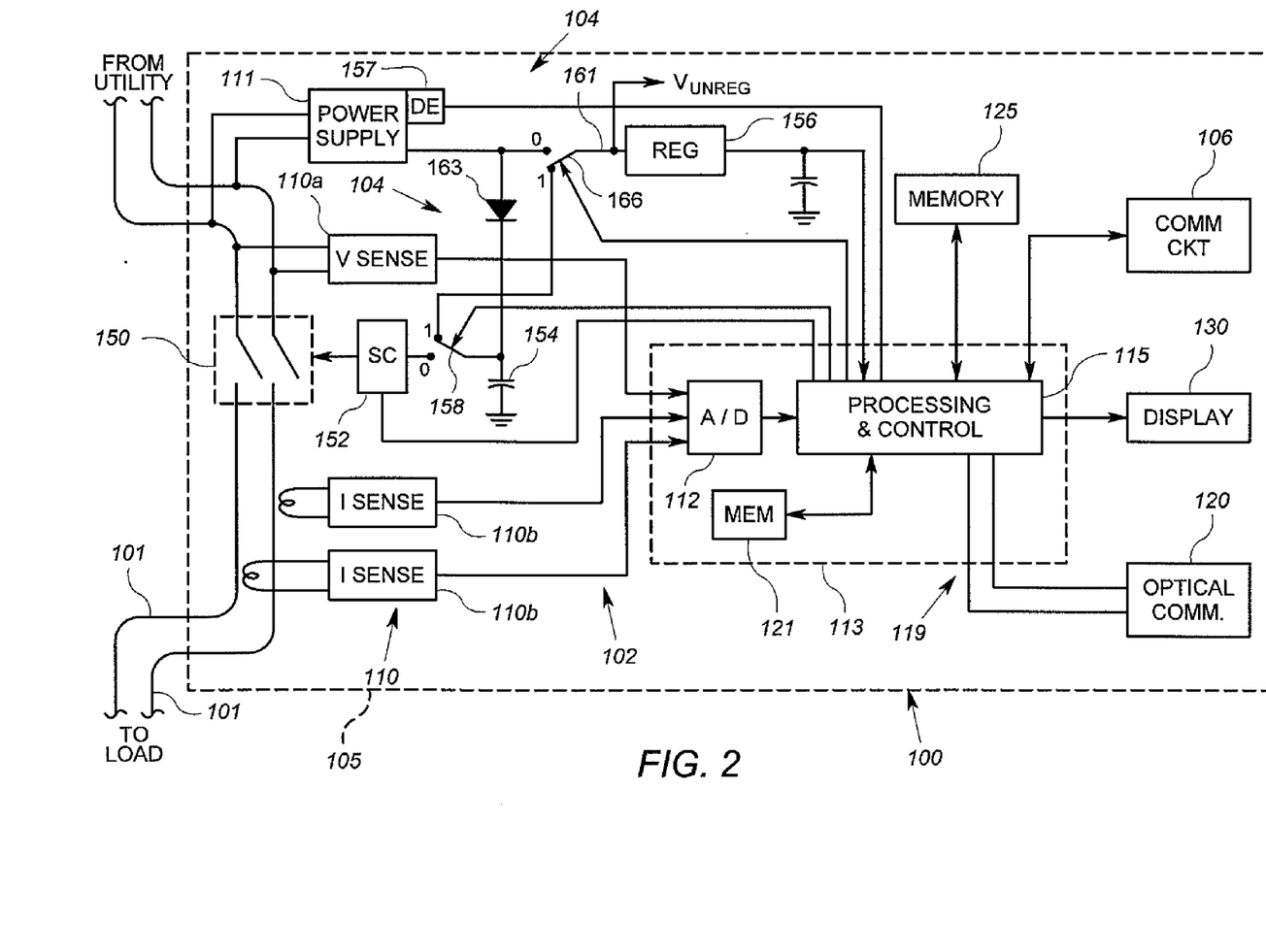
FIG. 2 is a schematic block diagram of an electricity meter according to a second exemplary embodiment of the invention.

FIG. 2 shows in further detail an exemplary meter 100 that incorporates a power management arrangement similar to that of FIG. 1. The meter 100 includes a housing 105 in which are disposed a metrology circuit 102, a power management arrangement 104, a remote communication circuit 106, a power supply 111, an optical communication circuit 120, data storage 125, a display 130, and a power interruption detection circuit 157. The metrology circuit 102 further includes a sensor circuit 110, an A/D conversion unit 112, and at least a portion of a processing and control ("P&C") circuit 115.

It will be appreciated that in the exemplary embodiment, the P&C circuit 115 is disposed within a commercially available chip package 113 that includes the A/D conversion unit 112 and other circuitry normally associated with an electronic meter, such as memory 121, and clock circuitry, not shown. The commercially available chip package 113 may suitably be the model 71M6513 measurement chip available from Maxim Integrated Products, Inc.

Referring now to the housing 105, the housing 105 may take any suitable form, and is generally configured to withstand a wide range of environmental conditions. The housing 105 also provides at least some protection against environmental conditions to the various elements disposed therein. Suitable housings for utility meters are well-known in the art.

As discussed above, the metrology circuit 102 includes the sensor circuit 110, as well as an A/D conversion unit 112 and the P&C circuit 115. The sensor circuit 110 in one embodiment includes voltage sensors 110*a* and current sensors 110*b* that are operably coupled to detect voltage and current signals representative of voltage and current provided to a load, and to generate measurement signals therefrom. In particular, the measurement signals generated by the sensor circuit 110 are analog signals each having a waveform representative of the voltage and current provided to the load. A suitable example of a voltage sensor 110*a* includes a resistive voltage divider that is operably coupled to the power lines 101. A suitable example of a current sensor 110*b* includes a current transformer that is disposed in a current sensing relationship with the power line signal. These and other voltage and current sensors are known in the art.

The A/D conversion unit 112 may be any suitable analog-to-digital converter that is configured to sample the analog measurement signals generated by the sensor circuit 110. The A/D conversion unit 112 is operably coupled to provide the resulting digital measurement signals to the P&C circuit 115.

The P&C circuit 115 is a circuit that is configured to receive the digital measurement signals from the A/D conversion unit 112 and generate energy consumption data therefrom. According to an exemplary embodiment, the P&C circuit 115 includes digital processing circuitry that processes the digitized measurement signals to thereby generate the energy consumption data. Such circuits are well known in the art. In addition, the P&C circuit 115 includes further functionality configured to exercise general supervisory control over data transmission, data display and data storage within the meter 10. In this embodiment, the P&C circuit 115 is also configured to control the power management arrangement 104 as described herein.

Accordingly, the P&C circuit 115 performs energy data processing, as well as controller operations. In an alternative embodiment, the P&C circuit 115 may be split into two separate devices, such as a digital signal processor ("DSP") and a controller, to carry out these tasks.

The memory 121 of the chip package 113 includes one or more storage devices of different types. The memory 121 may include volatile or non-volatile RAM, EEPROM, or other readable and writeable memory device, any of which may be incorporated into the integrated circuit package 113. The memory 121 stores instructions and/or parameters used by the P&C circuit 115, and may further store energy consumption data. By contrast, the memory 125 is external to the chip package 113, and provides for extended non-volatile data storage. Such memory 125 would also, however, be located within the housing 105.

The optical communication circuit 120 is operably coupled to the P&C circuit 115. The optical communication circuit 120 in this embodiment includes an optical transceiver, both of which are located at a translucent or transparent optical port, not shown. Similarly, the remote communication circuit 106 is operably coupled to the processing circuit 115. The remote communication circuit 106 may suitably be an RF transceiver, for example, a pager radio, or other wireless device that is capable of transmitting on a WAN, or on another wireless communication network. In alternative embodiments, the remote communication circuit 106 may include a power line modem.

The display 130 is operably coupled to the P&C circuit 115 and provides a visual display of information, such as information regarding the operation of the meter 100. For example, the display 130 may provide a visual display of information relating to the power measurement operations or energy consumption data of the meter 100.

The power supply 111 is a suitable circuit for generating an unregulated DC voltage from AC signals on the power lines 101. Such circuits are well known, and include switched mode power supplies. The power supply 111 operably connected to receive power from the power lines 101, and is configured to generate bias power for the circuitry of the meter 100 discussed above, including the chip package 113, the display 130, and the communication circuits 106 and 120. The power supply 111 is operably connected to the various circuits via the power management arrangement 104, as will be discussed below.

The power management arrangement 104 includes a service switch 150, a switch controller 152, a storage element 154, a voltage regulator circuit 156, a first switch 158, a second switch 160. The service switch 150 is operably coupled to controllably interrupt and restore connections in the power lines 101 from the utility to the load. The switch controller 152 may suitably be the same as the switch controller 22 of FIG. 1, and is connected to provide opening and closing force to the service switch 150. The storage element 154 may be the same as the energy storage element 24 of FIG. 1.

In the embodiment described herein, both the first switch 158 and the second switch 160 are implemented as single pole, double throw (SPDT) switches. However, it will be appreciated that other switch arrangements capable of carrying out operations equivalent to the SPDT switches as shown herein may readily be implemented. The first switch 158 is operably connected to controllably connect the energy storage device to either a first node 159 or the power input of the switch controller 152. The second switch 160 is operably connected to controllably connect an unregulated voltage input of the voltage regulator circuit 156 to either the power supply 150 or the first node 159. To this end, a second node 161 is defined at the unregulated voltage input of the voltage regulator circuit 156, and it is this node 161 that can be connected to either power supply 150 or the first node 159.

The voltage regulator circuit 156 may be any suitable regulator circuit that generates a regulated voltage output that can be used for biasing digital circuits. In general, the voltage regulator 156 is operably connected to provide regulated DC voltage to the integrated circuit package 113, the optical communication circuit 120, the memory 125 and the display 130. The communication circuit 106 is operably connected to receive unregulated voltage from the second node 161.

The power interruption detection circuit 157 is a circuit that is operably connected to detect a power interruption on the power lines 101 and generate a power failure detection signal therefrom. To this end, the power interruption detection circuit 157 may suitably be the same as the power interruption detector 52 of FIG. 1. The power interruption detection circuit 157 is operably connected to provide the power failure detection signal to the P&C circuit 115.

In addition to the foregoing, a diode 163 connects the output of the power supply 111 to the energy storage circuit 154 to facilitate charging of the energy storage circuit 154. The diode 163 is biased to allow current to flow from the power supply 111 to the energy storage circuit 154, but not from the energy storage circuit 154 to the power supply 111.

In this embodiment, the P&C circuit 115 is configured to selectively and controllably cause the switch 160 to couple the voltage regulator 156 to the power supply 111 (mode 0), and cause the switch 160 to couple the voltage regulator 156 to the first node 159 (mode 1). Similarly, the P&C circuit 115 is configured to selectively and controllably cause the switch 158 to couple the energy storage device 154 to the switch controller 152 (mode 0), and cause the switch 158 to couple the energy storage device 154 to the first node 159 (mode 1).

In normal energy delivery operation, the service switch 150 is closed, and the utility thereby provides electrical service to the load via power lines 101. The metrology circuit 102 performs operations to detect electrical signals on the power lines 101 and generating metering information therefrom. Such operations are known in the art. In such normal operation, the switch 158 connects the energy storage device 154 to the first node 159 (mode 1), and the switch 160 connects the power supply to the voltage regulator 156 (mode 0). In mode 0 of the switch 160, the voltage regulator 156 generates regulated voltage for the meter 100 using unregulated voltage generated by the power supply 111. When switch 158 is in mode 1, and the switch 160 is in mode 0, the energy storage device 154 is open-circuited at the first node 159.

The P&C circuit 115 and the power management arrangement 104 cooperate to employ the energy storage device 154 as an auxiliary power supply for both the communication circuit 106 and the service switch 150, and further to provide power to the P&C 115 circuit temporarily in the event of power outage. To this end, the P&C circuit 115 carries out the FIGS. 3 and 4 to control the operations of the power management circuit 104 and other elements within the meter 110.

Figure 3:
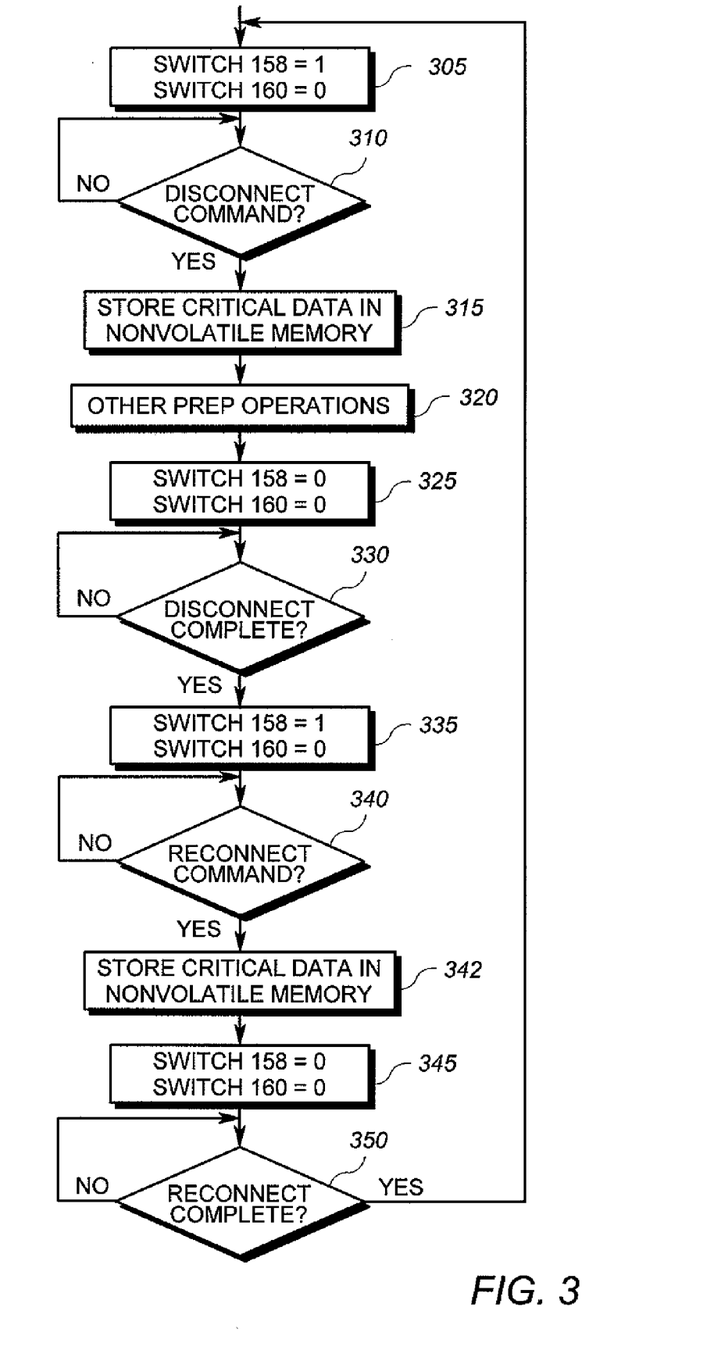
FIG. 3 is a flow diagram of exemplary operations of a control circuit of the meter of FIG. 2 that may be carried out to implement service switch operations.

FIG. 3 shows the operations of the P&C circuit 115 for a service switch routine that may be executed in conjunction with other meter software routines, not shown, but facilitate the normal operations of the meter 100. In particular, it will be understood that the P&C circuit 115 carries out metrology routines, display routines, communication routines, and the like, in any suitable manner which would be known to those of ordinary skill in the art. The service switch routine of FIG. 3 runs in addition to such other routines, and is primarily responsible for service switch operations.

In step 305, the P&C circuit 115 causes the first switch 158 to be in mode 1 and the second switch 160 to be in mode 0. As discussed, this configuration of the switches 158, 160 corresponds to normal metering operations. The P&C circuit 115 thus may perform step 305 initially during meter power-up, and as otherwise indicated herein.

In step 310, the P&C circuit 115 determines whether a disconnect command has been received. The P&C circuit 115 may receive the disconnect command (i.e. a data signal with instruction data) from either the remote communication circuit 106 or the optical communication circuit 120 indicating that the service is to be disconnected. Alternatively, other software within the P&C circuit 115 may generate a disconnect command. If no disconnect command has been received, then the P&C circuit 115 continues to loop in step 310. If a disconnect command has been received, then the P&C circuit 115 proceeds to step 315. It will be appreciated that step 310 may be carried out as an interrupt routine that executes step 315 upon receipt of an interrupt derived from or defined as the disconnect command.

In step 315, the P&C circuit 115 first stores critical meter data into the non-volatile memory 125. The critical meter data may include all data that would otherwise be stored in the event of power outage, including accumulated energy consumption data, billing data, and the like. The P&C circuit 115 stores the critical meter data in the event that a power interruption occurs while the service switch 150 is opening and/or when the energy storage device 154 is otherwise depleted immediately after opening of the service switch 150. This storage step 315 ensures that the critical data is save even if insufficient energy is temporarily unavailable in the energy storage device 154 to carry out the power down operations of FIG. 4 after operation of the service switch 150.

Thereafter, in step 320, the P&C circuit 115 performs other steps in preparation for disconnecting the service from the load. For example, the P&C circuit 115 may generate warning alarms or visible indicators for a short period prior to actual disconnection. The P&C circuit 115 may also need to ensure that the energy storage device 154 is sufficiently charged (such as waiting a predetermined time after a prior disconnect or power fail period).

After step 320, the P&C circuit 115 executes step 325. In step 325, the P&C circuit 115 causes the switch 158 to switch to mode 0, thereby connecting the energy storage device 154 to the switch controller 152. The P&C circuit 115 also provides "open" control signals to the P&C circuit 115. Responsive to the "open" control signals and the power from the energy storage device, the switch control device 152 causes the switch 150 to move from the closed state to the open state. The P&C circuit 115 leaves the switch 160 in mode 0, so that the power supply 111 remains the source of power to the voltage regulator 156 and all downstream circuits.

The P&C circuit 115 then proceeds to step 330 to determine whether the disconnect process is complete. The P&C circuit 115 may determine completion of the disconnect process using any suitable method, such as waiting a predetermined period after obtaining a zero voltage input from the voltage sensor 110$a$. The P&C circuit 115 remains in step 330 until it is determined that the disconnect process is complete. Once complete, P&C circuit 115 proceeds to step 335.

Once the switch 150 is open, the load has its electrical service disconnected. In step 335, the P&C circuit 115 transitions the first switch 158 to mode 1, which disconnects the energy storage circuit 154 from the switch controller 152. The voltage regulator 156 remains connected to the power supply 111 so that, among other things, the P&C circuit 115 can at some later time perform the operations (e.g. steps 345, 350 discussed below) to restore power to the load. The P&C circuit 115 thereafter proceeds to step 340.

In step 340, the P&C circuit 115 determines whether a restore command has been received. The P&C circuit 115 may receive the restore command (i.e. a data signal with instruction data) from either the remote communication circuit 106 or the optical communication circuit 120 indicating that the service is to be restored. Alternatively, other software within the P&C circuit 115 may generate a restore command. If no restore command has been received, then the P&C circuit 115 continues to loop in step 340. If a restore command has been received, then the P&C circuit 115 proceeds to step 342. As with step 310, step 340 may be carried out as an interrupt routine.

In step 342, the P&C circuit 115 first stores critical meter data into the non-volatile memory 125. As with step 315, the critical meter data may include all data that would otherwise be stored in the event of power outage, including accumulated energy consumption data, billing data, and the like. However, little or no consumption data typically accumulates or changes while the switch 150 is open, because no electricity is being delivered to the load. Nevertheless, the P&C circuit 115 stores other critical data that can accumulate while the service switch 150 is open. For example, the P&C circuit 115 may maintain a log of attempts to communicate with the meter 100 (via the RF communication circuit 106 or optical communication circuit 120) while the switch is open. The P&C circuit 115 may also maintain a log of tamper events that occur while the switch is open. In step 342, the P&C circuit 115 may store such logs to non-volatile memory 125. Such storage prevents of the loss of such data should a power failure occur immediate after closure of the switch 150 and before the energy storage device 154 has had a chance to sufficiently recharge.

In addition, the persistently stored critical data can include an indication that the close service switch command has been received (in step 340). Persistent storage of this data is important in the event that the power failure occurs prior to closure of the switch 150 after receiving the command to close the switch. Otherwise, when power is restored, the switch 150 would still be open, and the close service switch command would have been lost. Such operation could unnecessarily delay restoration of power to the customer.

Thereafter, in step 345, the P&C circuit 115 causes the switch 158 to switch to mode 0, thereby connecting the energy storage device 154 to the switch controller 152. The P&C circuit 115 also provides "close" control signals to the P&C circuit 115. Responsive to the "close" control signals and the power from the energy storage device 154, the switch control device 152 causes the switch 150 to move from the open state to the closed state. The P&C circuit 115 leaves the switch 160 in mode 0, so that the power supply 111 remains the source of power to the voltage regulator 156 and all downstream circuits.

The P&C circuit 115 then proceeds to step 350 to determine whether the restore process is complete. The P&C circuit 115 may determine completion of the restore process using any suitable method, such as waiting a predetermined period after obtaining a normal voltage input from the voltage sensor 110a. The P&C circuit 115 remains in step 350 until it is determined that the restore process is complete. Once complete, P&C circuit 115 returns to step 305 to proceed with normal operations.

The process of FIG. 3 illustrates, among other things, how the power management circuit 104 provides power to the service switch arrangement during disconnect and restore processes.

Figure 4:
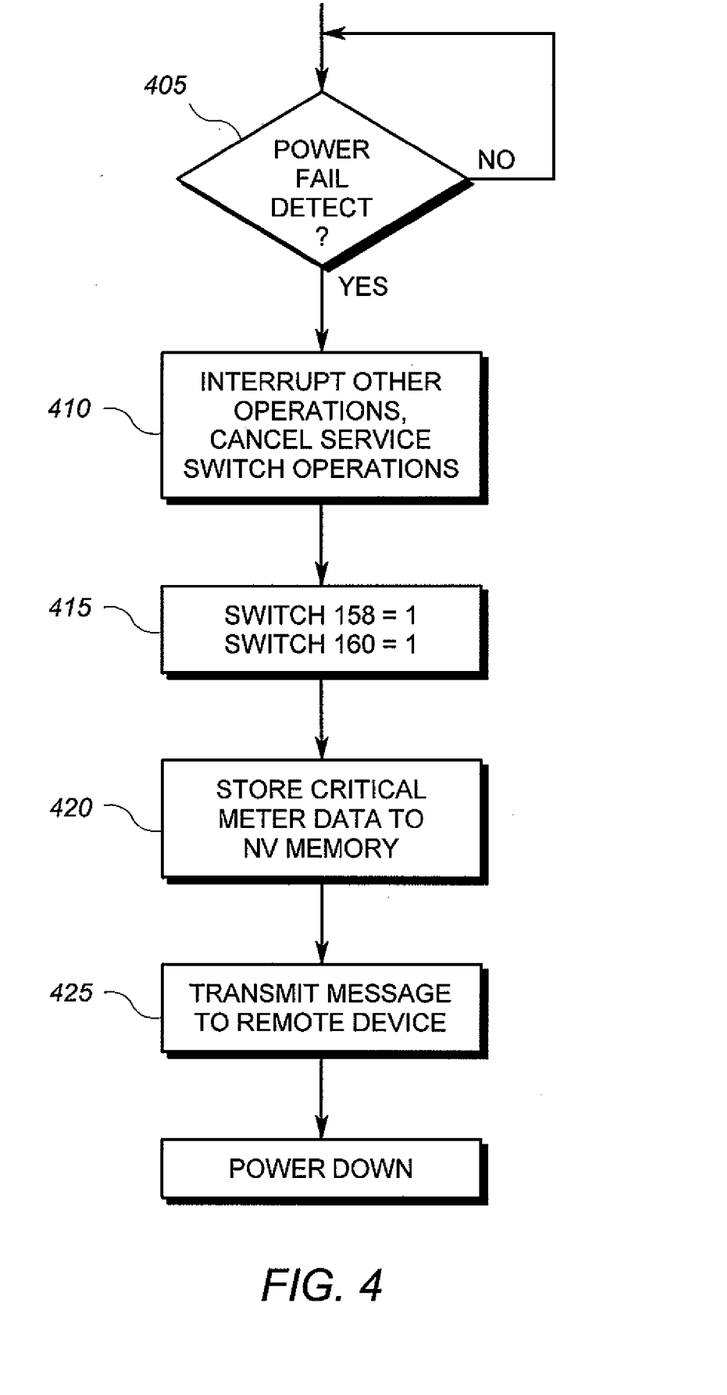
FIG. 4 is a flow diagram of exemplary operations of a control circuit of the meter of FIG. 2 that may be carried out to implement power fail operations.

FIG. 4 illustrates a set of operations executed by the P&C circuit 115 to carry out operations in the event of a power failure or power interruption on the power lines 101 from the utility side. Such a power failure may occur as a result of damage to power lines during inclement weather, as a result of failure of all or part of the electricity grid in the relevant region for other reasons. The operations of FIG. 4 define a routine or set of routines that are performed in addition to the routines of FIG. 3 and other software routines of the P&C circuit 115.

In step 405, the P&C circuit 115 determines whether a power interruption detection signal has been received from the detection circuit 157. If no power interruption detection signal has been received, then the P&C circuit 115 continues to loop in step 405, and other metering operations may continue. If, however, a power interruption detection signal has been received, then the P&C circuit 115 proceeds to step 410. As with step 310, step 405 may be carried out as an interrupt routine.

In step 410, the P&C circuit 115 interrupts any current operation. For example, the P&C circuit 115 cancels any "disconnect" operations or commands, and would halt the operation of the steps displayed in FIG. 3. The P&C circuit 115 then proceeds to step 415.

In step 415, the P&C circuit 115 causes the switch 158 to remain in, or switch to, mode 1, thereby connecting the energy storage device 154 to the first node 159. The P&C circuit 115 also causes the switch 160 to transition to mode 1, so that the input of the voltage regulator 156 is disconnected from the power supply 111 and connected to the first node 159. The switches 158, 160 thereby connect the energy storage device 154 to the second node 161, or in other words, to the input of the voltage regulator 156. In this configuration, the energy storage device 154 is also connected to provide power to the communication circuit 106. As a result of step 415, the energy storage device 154 effectively takes over the role of the power supply 111, at least temporarily. The P&C circuit 115 thereafter proceeds to step 420. It will be appreciated that, before the energy storage device 154 is enabled as the surrogate power supply, a small capacitor 170 (coupled between ground and the connection between the regulator 156 and the P&C circuit 115) provides temporary power to the P&C circuit 115 to enable it to carry out steps 410 and 415. (See FIG. 2). It will be appreciated that such capacitor 170 is relatively small in size (compared to the energy storage device 154) and is generally not sufficient to power a transmission, storage to non-volatile memory 125, and/or operation of the service switch 150

In step 420, the P&C circuit 115 stores critical meter data to the non-volatile memory 125, similar to step 315, discussed further above. The P&C circuit 115 thereafter proceeds to step 425.

In step 425, the P&C circuit 115 causes a "last gasp" message to be transmitted by the communication circuit 106 to a remote device. As is known in the art, it is advantageous for a meter to transmit to a utility a message indicating that power has been interrupted. The utility can use such messages from multiple meters to help pinpoint the source of the power distribution system fault. The communication circuit 106 transmits the message using power derived from the energy storage device 154.

Thereafter, the P&C circuit 115 may power down. When the meter 100 powers up, the P&C circuit will likely automatically return to the state in which the switch 158 is in mode 1, and the switch 160 is in mode 0. In the alternative, the P&C circuit 115 may make those transitions before powering down.

Referring again generally to FIG. 2, it will also be appreciated that the P&C circuit 115 may from time to time need to transmit information using the communication circuit 106 in conditions that do not involve a power interruption. In such a case, the P&C circuit 115 causes the switches 158 and 160 to be in mode 1, thereby allowing the extra power stored in the energy storage device 154 to be used for the transmission (and any other concurrent circuit operations). In some embodiments, a separate switch may be provided from the energy storage device 154 to the communication circuit 106 for use during normal transmission operations, thereby taking advantage of the power boost of the energy storage device 154 for RF transmissions, while retaining the use of the power supply 111 for powering all other concurrent operations.

It will be appreciated that the above-describe embodiments are merely exemplary, and that those of ordinary skill in the art may readily devise their own implementations and adaptations that incorporate the principles of the present invention and fall within the spirit and scope thereof.

We claim:

1. An arrangement for controllably disconnecting a utility power service from a load, comprising:
    a utility meter housing including metrology circuitry configured to generate metering information regarding electrical power provided to the load, the utility meter including a connection to the utility power service;
    a service switch configured to controllably interrupt a connection between the utility power service and the load, the service switch having a controller;
    an energy storage device;
    a first switch element configured to selectively connect a meter power supply to at least a portion of the metrology circuit in a first configuration, and connect a first node to the metrology circuit in a second configuration;
    a second switch element configured to selectively connect the energy storage device to the controller in a first configuration, and connect the energy storage device to the first node in a second configuration;
    a control circuit configured to:
    cause the first switch element to be in the first configuration and the second switch element to be in the first configuration responsive to a service disconnect command, and
    cause the first switch element to be in the second configuration and the second switch element to be in the second configuration responsive to a power interruption detection signal.

2. The arrangement of claim 1, further comprising a power fail detection circuit configured to generate the power interruption detection signal responsive to a detection of a power interruption at the connection to the utility power service.

3. The arrangement of claim 1, wherein the control circuit is further configured to cause the first switch element to be in the second configuration and the second switch element to be in the second configuration responsive to receiving a service disconnect command while receiving a power interruption detection signal.

4. The arrangement of claim 1, wherein the control circuit is further configured to perform a sequence of operations responsive to a service disconnect command prior to causing the second switch element to be in the first configuration.

5. The arrangement of claim 1, wherein control circuit includes a processing circuit that is further configured to perform energy metering calculations.

6. The arrangement of claim 1, wherein the metrology circuit includes voltage and current sensors.

7. An arrangement for controllably disconnecting a utility power service from a load, comprising:
    a utility meter housing including metrology circuitry configured to generate metering information regarding electrical power provided to the load, the utility meter including a connection to the utility power service;
    a service switch configured to controllably interrupt a connection between the utility power service and the load, the service switch having a controller;
    an energy storage device;
    a control circuit configured to:
    cause the energy storage device to be connected to the controller responsive to a service disconnect command, and
    cause a portion of the metrology circuit to be connected to the energy storage device and the meter power supply to be disconnected from the portion of the metrology circuit responsive to a power interruption detection signal.

8. The arrangement of claim 7, wherein control circuit includes a processing circuit that is further configured to perform energy metering calculations.

9. The arrangement of claim 7, wherein the metrology circuit includes voltage and current sensors.

10. The arrangement of claim 7, wherein the control circuit is further configured to cause the energy storage device to be disconnected from the controller when causing the energy storage device to be connected to at least a portion of the metrology circuit.

11. The arrangement of claim 7, further comprising a communication circuit, and wherein the control circuit is further configured to:
    cause the energy storage device to be connected to the communication circuit when the energy storage device is disconnected from the controller; and
    cause the energy storage device to be disconnected from the communication circuit when the energy storage device is connected to the controller.

12. The arrangement of claim 7, further comprising a charging circuit coupled between the meter power supply and the energy storage device.

13. The arrangement of claim 12, wherein the charging circuit comprises a diode.

14. The arrangement of claim 7, wherein the control circuit is further configured to cause at least some metering data to be stored to non-volatile memory responsive to the service disconnect command prior to causing the energy storage device to be connected to the controller.

15. The arrangement of claim 7, wherein the control circuit is further configured to:
    cause the energy storage device to be connected to the controller responsive to a service restore command.

16. The arrangement of claim 15, wherein the control circuit is further configured to cause at least some meter data to be stored to non-volatile memory responsive to the service restore command prior to causing the energy storage device to be connected to the controller.

* * * * *